United States Patent
Oomori et al.

(12)

(10) Patent No.: US 6,340,553 B1
(45) Date of Patent: Jan. 22, 2002

(54) POSITIVE-WORKING PHOTORESIST COMPOSITION

(75) Inventors: Katsumi Oomori, Chigasaki; Hiroto Yukawa, Zama; Akiyoshi Yamazaki, Yokohama; Kazuo Tani, Kanagawa-ken; Yohei Kinoshita, Sagamihara; Tomotaka Yamada, Atsugi, all of (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/585,616

(22) Filed: Jun. 2, 2000

(30) Foreign Application Priority Data

Jun. 2, 1999 (JP) ............................................ 11-154908

(51) Int. Cl.$^7$ .............................................. G03F 7/004
(52) U.S. Cl. .................................................... 430/270.1
(58) Field of Search ...................................... 430/270.1

(56) References Cited

U.S. PATENT DOCUMENTS

| 5,679,495 A | 10/1997 | Yamachika et al. | ......... 430/191 |
| 5,861,231 A | 1/1999 | Barclay et al. | .......... 430/270.1 |
| 6,136,504 A | * 10/2000 | Tan et al. | ................. 430/270.1 |
| 6,156,481 A | * 12/2000 | Takeda et al. | ........... 430/270.1 |

FOREIGN PATENT DOCUMENTS

| JP | 8-101509 | 4/1996 |
| JP | 9-73173 | 3/1997 |
| JP | 10-161313 | 6/1998 |

* cited by examiner

Primary Examiner—Rosemary Ashton
(74) Attorney, Agent, or Firm—Wenderoth, Lind & Ponack, LLP

(57) ABSTRACT

Disclosed is a novel positive-working chemical-amplification photoresist composition used in the photo-lithographic patterning works in the manufacture of semiconductor devices capable of giving an excellently patterned resist layer with remarkably small film thickness reduction by the development treatment with an aqueous alkaline developer solution in the areas unexposed to patternwise exposure to light. Characteristically, the resinous ingredient in the composition, which is formulated in combination with a radiation-sensitive acid-generating agent and imparted with an increase in the solubility in an alkaline developer solution, is a ternary copolymeric resin consisting of the monomeric units of (a) hydroxystyrene units, (b) styrene units and (c) 1-alkylcyclohexyl (meth)acrylate units each in a specified molar fraction.

14 Claims, No Drawings

POSITIVE-WORKING PHOTORESIST COMPOSITION

BACKGROUND OF THE INVENTION

The present invention relates to a novel positive-working photoresist composition used in the photolithographic patterning process for the manufacture of electronic devices or, more particularly, to a positive-working chemical-amplification photoresist composition exhibiting a great change in the solubility in an aqueous alkaline developer solution by exposure to actinic rays and capable of giving a patterned resist layer with high contrast and good pattern resolution and wide focusing depth latitude.

It is a progressive trend in recent years in the manufacturing process of a variety of electronic devices by utilizing a photoresist composition that a photolithographic patterning process capable of giving a patterned resist layer with pattern resolution as fine as 0.25 μm or even finer is rendered to practical application to be in compliance with the increasing demand for semiconductor devices having a higher and higher degree of integration. In this regard, intensive investigations are now under way for the development of a photolithographic patterning process by utilizing KrF excimer laser beams as the actinic rays for exposure of the resist layer with an object to accomplish pattern resolution of 0.15 to 0.22 μm fineness as a next-generation process.

The feasibility of the above mentioned photolithographic process of high pattern resolution naturally depends on the performance of the photoresist composition used therefor. For example, Japanese Patent Kokai 7-209868 and 10-186665 disclose a positive-working chemical-amplification photoresist composition of which the resinous ingredient is a ternary copolymer consisting of hydroxystyrene or hydroxy-α-methyl-styrene units, styrene units and tert-butyl (meth)acrylate units.

As compared with the positive-working photoresist compositions using a resinous ingredient consisting of polyhydroxystyrene substituted for a part of the hydroxyl groups by acid-dissociable solubility-reducing groups, the above mentioned ternary copolymer is advantageous in respect of small film thickness reduction in the unexposed areas by the development treatment with an aqueous alkaline developer solution to give a patterned resist layer having an excellently orthogonal cross sectional profile. This advantageous behavior of the ternary copolymer in development, however, is still far from sufficient in respect of the contrast of patterning, i.e the solubility change in an aqueous alkaline developer solution by exposure to light, when the above mentioned extremely fine pattern resolution of patterning is targeted.

On the other hand, a photoresist composition is proposed in Japanese Patent Kokai 8-101509 by utilizing a homopolymeric resin of a 1-alkylcycloalkyl acrylate or a binary copolymeric resin thereof with hydroxystyrene. The photoresist composition proposed there, however, is defective due to the relatively large film thickness reduction in the unexposed areas by development not to give an excellently patterned resist layer.

Further, Japanese Patent Kokai 9-73173 discloses a positive-working photoresist composition for exposure with ArF excimer laser beams, in which the resinous ingredient is imparted with an increased acid-dissociability by utilizing an acid-dissociable group having an alkyl group substituting the carbon atom at which an ester group and a cyclic hydrocarbon group are bonded together. Japanese Patent Kokai 10-161313 proposes a positive-working photoresist composition for exposure with ArF excimer laser beams imparted with sensitivity improved still more by using an acid-dissociable group having an alkyl group of at least two carbon atoms introduced into a carbon atom similar to the above. These photoresist compositions, however, are not suitable for exposure with KrF excimer laser beams due to the absence of hydroxystyrene units in the resinous ingredient and also have a problem of relatively low resistance against dry etching when the acid-dissociable group is a cyclohexyl group.

SUMMARY OF THE INVENTION

The present invention accordingly has an object, in order to overcome the above described disadvantages in the conventional photoresist compositions, to provide a novel positive-working chemical-amplification photoresist composition suitable for exposure with KrF excimer laser beams and capable of giving a resist layer exhibiting a large change in the solubility in an aqueous alkaline developer solution by exposure to light and giving a patterned resist layer having high contrast and high pattern resolution as well as large focusing depth latitude.

Thus, the positive-working chemical-amplification photoresist composition provided by the present invention comprises, as a uniform solution in an organic solvent:

(A) a resinous compound capable of being imparted with an increase in the solubility in an aqueous alkaline solution by interacting with an acid and consisting essentially of (a) hydroxystyrene units or hydroxy-α-methylstyrene units, (b) styrene units and (c) 1-alkylcyclohexyl (meth)acrylate units represented by the general formula

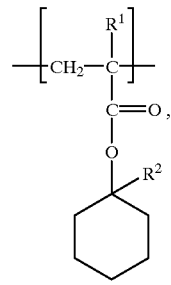

in which $R^1$ is a hydrogen atom or a methyl group and $R^2$ is an alkyl group having 1 to 5 or, preferably, 2 to 4 carbon atoms in molar fractions of 40 to 80%, 10 to 40% and 2 to 30%, respectively; and (B) a radiation-sensitive acid-generating agent capable of releasing an acid by irradiation with actinic rays.

It is preferable that the resinous ingredient as the component (A) is a combination of two different resinous compounds each falling within the definition of the component (A) but being different in the molar fractions of the monomeric units (b) and (c).

It is also preferable that the photoresist composition further comprises (C) an aliphatic tertiary amine compound and/or (D) a phosphorus-containing oxoacid or an ester thereof each in a specified amount.

The invention further provides a positive-working chemical-amplification resist composition comprising:

(A) a resinous compound capable of being imparted with an increase in the solubility in an aqueous alkaline solution by interacting with an acid and consisting essentially of (a) hydroxystyrene units or hydroxy-α- methylstyrene units, (b) styrene units and (c) 1-alkylcyclohexyl (meth)acrylate units represented by the general formula

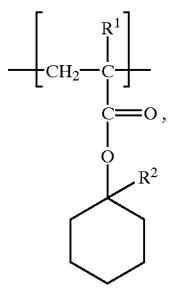

in which $R^1$ is a hydrogen atom or a methyl group and $R^2$ is an alkyl group having 1 to 5 or, preferably, 2 to 4 carbon atoms; and (B) a radiation-sensitive acid-generating agent capable of releasing an acid by irradiation with actinic rays, and capable of forming, on a substrate surface, a layer of which the rate of thickness reduction by dissolution at 23° C. in a 4.5% by weight aqueous solution of tetramethylammonium hydroxide is in the range from 0.01 to 100 nm per second or, preferably, from 1 to 30 nm per second.

DETAILED DESCRIPTION OF THE PREFERRED EMBODIMENTS

The above described unique formulation of the inventive photoresist composition has been established as a result of the extensive investigations undertaken by the inventors with the above mentioned object leading to an unexpected discovery that a photoresist composition of excellent performance can be obtained by using a ternary copolymeric resin consisting of the monomeric units (a), (b) and (c) in specific molar fractions as the film-forming resinous ingredient.

Namely, the resinous ingredient as the component (A) in the inventive photoresist composition is a ternary copolymeric resin consisting of (a) hydroxy-α-methylstyrene units, (b) styrene units and (c) 1-alkylcyclohexyl (meth)acrylate units in specified molar fractions. The monomeric unit (c) is the unit to provide an acid-dissociable group having a solubility-reducing effect on the resin in an aqueous alkaline solution and, when a layer of the inventive photoresist composition on a substrate is patternwise exposed to actinic rays, dissociation of the 1-alkylcyclohexyl groups takes place by interaction with the acid released from the component (B) in the exposed areas thus to increase the alkali-solubility of the resist layer.

When the resinous ingredient as the component (A) is the above described ternary copolymer consisting of the monomeric units (a), (b) and (c), the resist layer in the unexposed areas has high resistance against the dissolving attack of an aqueous alkaline solution so that the patterned resist layer formed by development has an excellently orthogonal cross sectional profile with high contrast and pattern resolution as well as large focusing depth latitude with little film thickness reduction in the unexposed areas.

The group denoted by $R^2$ in the general formula representing the monomeric units (c) is a normal or branched alkyl group having 1 to 5 carbon atoms exemplified by methyl, ethyl, n-propyl, isopropyl, n-butyl, isobutyl, sec-butyl and tert-butyl groups as well as various isomeric pentyl groups, of which those having 2 to 4 carbon atoms are preferable in respect of obtaining high contrast, high pattern resolution and large focusing depth latitude.

The molar fractions of the respective kinds of the monomeric units constituting the resinous ingredient as the component (A) are: from 40 to 80% or, preferably, from 50 to 70% of the units (a); from 10 to 40% or, preferably, from 15 to 30% of the units (b); and from 2 to 30% or, preferably, from 5 to 20% of the units (c) in consideration of the influences on the sensitivity and the cross sectional profile of the patterned resist layer.

It is optional that the resinous ingredient as the component (A) is a combination of two kinds or more of ternary copolymeric resins each falling within the above given definition of the component (A). In particular, the component (A) is preferably a combination of two different resins (A-1) and (A-2) of which the molar fractions of the monomeric units (a), (b) and (c) are from 50 to 70% of the monomeric units (a), from 10 to 30% of the monomeric units (b) and from 10 to 20% of the monomeric units (c) for (A-1) and from 50 to 70% of the monomeric units (a), from 20 to 40% of the monomeric units (b) and from 2 to 10% of the monomeric units (c) for (A-2) in a weight proportion of (A-1):(A-2) in the range from 90:10 to 30:50 or, preferably, from 80:20 to 55:45.

It is further optional that the resinous ingredient as the component (A) is a copolymeric resin comprising, in addition to the monomeric units (a), (b) and (c), other types of monomeric units in a small molar fraction derived from a known (meth)acrylate monomer other than the 1-alkylcyclohexyl (meth)acrylate giving the monomeric units (c). A criterion for the selection of such a fourth and further comonomers is given by the rate of film thickness reduction of the resin layer in a 4.5% by weight aqueous solution of tetramethyl-ammonium hydroxide at 23° C. which should be in the range from 0.01 to 100 nm/second or, preferably, from 1 to 30 nm/second.

The other essential ingredient in the inventive photoresist composition is the component (B) which is a radiation-sensitive acid-generating agent or, namely, a compound capable of being decomposed by the irradiation with actinic rays to release an acid. A variety of known radiation-sensitive acid-generating compounds conventionally used in chemical-amplification photoresist compositions can be used here without particular limitations, of which onium salt compounds having a fluoroalkyl sulfonate ion of 1 to 10 carbon atoms as the anion are particularly preferable.

Examples of such an onium salt compound include diphenyliodonium trifluoromethanesulfonate and nonafluorobutanesulfonate, bis(4-tert-butylphenyl)iodonium trifluoromethanesulfonate and nonafluorobutanesulfonate, triphenylsulfonium trifluoromethanesulfonate and nonafluorobutanesulfonate, tri(4-methylphenyl)sulfonium trifluoromethanesulfonate and nonafluorobutanesulfonate and the like, of which bis(4-tert-butylphenyl)iodonium trifluoromethanesulfonate and nonafluorobutanesulfonate are particularly preferable although any of the above named onium salt compounds can be used either singly or in combination of two kinds or more.

The amount of the radiation-sensitive acid-generating agent as the component (B) in the inventive photoresist composition is in the range from 1 to 10 parts by weight per 100 parts by weight of the resinous ingredient as the component (A). When the amount of the component (B) is too small, a patterned resist layer can hardly be formed while, when the amount thereof is too large, difficulties are encountered in the preparation of the photoresist composition in the form of a uniform solution due to the limited solubility of the compound in an organic solvent or, even if a uniform solution could be obtained, the solution suffers a decrease in storage stability over a length of time.

In addition to the above described essential ingredients, i.e. components (A) and (B), it is advantageous that the inventive photoresist composition contains an aliphatic tertiary amine compound as the component (C) in order to improve the cross sectional profile of the patterned resist layer and the holding stability of the latent images in the resist layer after patternwise exposure to actinic rays.

Examples of aliphatic tertiary amine compounds suitable for this purpose include trimethylamine, triethylamine, tri-n-propylamine, triisopropylamine, tri-n-butylamine, triisobutylamine, tri-tert-butylamine, tripentylamine, triethanolamine, tributanolamine and the like, of which triethanolamine is particularly preferable although any of the above named amine compounds can be used either singly or as a combination of two kinds or more. The amount of the amine compound in the inventive photoresist composition is, if it is added, in the range from 0.01 to 1.0 part by weight per 100 parts by weight of the component (A) in consideration of the influences on the holding stability of the exposed photoresist layer, sensitivity and cross sectional profile of the patterned resist layer.

It is further advantageous that the inventive photoresist composition is admixed with a phosphorus-containing oxoacid or an ester thereof as the component (D) with an object to ensure good orthogonality of the cross sectional profile of the patterned resist layer without trailing of skirts and upword narrowing when the resist layer is to be formed on a substrate surface having a coating layer of various materials including silicon nitrides, i.e. SiN, $Si_3N_4$ and SiON, titanium nitride TiN, phosphorus-and/or boron-containing glass PSG, BSG and BPSG and the like.

Examples of the phosphorus-containing oxoacids suitable for the purpose include phosphoric acid, phosphorous acid, phopsphonic acid and phosphinic acid. Esters of these phosphorus-containing acids can also be used as the component (D) including monomethyl, monophenyl, monobenzyl, dimethyl, di-n-butyl, diphenyl and dibenzyl esters of the acids, of which phenyl phosphonate is particularly preferable.

The amount of the component (D) in the inventive photoresist composition is, if it is added, in the range from 0.01 to 5 parts by weight or, preferably, from 0.1 to 2.0 parts by weight per 100 parts by weight of the component (A). When the amount of the component (D) is too small, improvements as desired cannot be accomplished as a matter of course while, when the amount thereof is too large, the photoresist layer may suffer a problem of film thickness reduction in the development treatment after patternwise exposure to actinic rays.

The photoresist composition of the invention is used in the form of a uniform solution prepared by dissolving the above described essential components and optional components in a suitable organic solvent each in a specified amount. Examples of organic solvents suitable for the purpose include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate though not particularly limitative thereto. These organic solvents can be used either singly or as a mixture of two kinds or more.

It is of course optional that the inventive photoresist composition prepared in the above described manner is further admixed with a variety of known additives conventionally used in photoresist compositions including auxiliary resins for improvement of the film properties of the resist layer, plasticizers, stabilizers, coloring agents, surface active agents and so on each in a limited amount.

The photolithographic patterning process by using the inventive photoresist composition is not particularly different from that by using a conventional photoresist composition. For example, a substrate such as a semiconductor silicon wafer optionally provided with a coating film of the above mentioned coating material and an antireflection coating film of an organic antireflection agent is uniformly coated with the inventive photoresist composition by using a suitable coating machine such as spinners followed by a pre-baking treatment to form a dried photoresist layer on the substrate surface. Thereafter, the photoresist layer is patternwise exposed to actinic rays such as KrF excimer laser beams on a suitable light-exposure machine through a pattern-bearing photomask to build a latent image in the photoresist layer followed by a post-exposure baking treatment. Each of the temperatures for the pre-baking treatment and the post-exposure baking treatment should be 130° C. or higher or, preferably, 140° C. or higher because the acid-dissociability of the 1-alkyl-cyclohexyl groups in the component (A) are lower than that of conventional acid-dissociable groups such as acetal groups and tert-butoxycarbonyloxy groups.

The photoresist layer bearing the latent image after the post-exposure baking treatment is then subjected to a development treatment with an aqueous alkaline developer solution such as a 0.1 to 10% by weight aqueous solution of tetramethylammonium hydroxide to form a positively patterned photoresist layer having high fidelity to the photomask pattern.

The photoresist composition of the present invention is also suitable for patterning by scanning with electron beams.

In the following, the positive-working photoresist composition of the present invention is described in more detail by way of Examples, which, however, never limit the scope of the invention in any way. In the following description, the term of "parts" always refers to "parts by weight".

Example 1.

A positive-working photoresist composition in the form of a uniform solution was prepared by dissolving, in 300 parts of ethyl lactate, 67 parts of a first copolymeric resin, referred to as the resin A1 hereinafter, having a weight-average molecular weight of 8000 and consisting of 67% by moles of 4-hydroxystyrene units, 22% by moles of styrene units and 11% by moles of 1-ethylcyclohexyl methacrylate units, 33 parts of a second copolymeric resin, referred to as the resin A2 hereinafter, having a weight-average molecular weight of 8000 and consisting of 67% by moles of 4-hydroxystyrene units, 29% by moles of styrene units and 4% by moles of 1-ethylcyclohexyl methacrylate units, 3.0 parts of diphenyliodonium trifluoromethanesulfonate, 0.1 part of triethanolamine and 0.1 part of phenyl phosphonate with further addition of a fluorine-containing surface active agent (Fluorad FC-171, a product by 3M Co.) in an amount of 1.0% by weight based on the total amount of the solution followed by filtration of the solution through a membrane filter of 0.2 μm pore diameter. The rates of film thickness reduction of the coating films formed from the resin A1 or A2 alone were 0.5 nm/second and 2 nm/second, respectively, at 23° C. in a 4.5% by weight aqueous solution of tetramethylammonium hydroxide while the rate of film thickness reduction was 1.0 nm/second for a 67:33 by weight mixture of the resins A1 and A2.

A semiconductor silicon wafer provided on the surface with a 60 nm thick antireflection coating film of an antireflection coating solution (AR 3, a product by Shipley Co.) was uniformly coated on a spinner with the above prepared photoresist solution followed by a pre-baking treatment for 90 seconds at 140° C. on a hot plate to form a photoresist layer having a thickness of 0.45 μm.

The photoresist layer thus formed was exposed patternwise to KrF excimer laser beams through a half-tone photomask on a minifying projection exposure machine (Model FPA-3000EX3, NA=0.6, manufactured by Canon Co.) followed by a post-exposure baking treatment at 140° C. for 90 seconds and then subjected to a puddle-development treatment in a 2.38% by weight aqueous solution of tetramethylammonium hydroxide at 23° C. for 60 seconds finally followed by a post-development baking treatment at 100° C. for 60 seconds to give a positively patterned resist layer.

The pattern resolution of the patterned resist layer thus obtained was so good that a hole pattern of 0.15 μm diameter could be obtained with good resolution. The focusing depth latitude was 1.05 μm for the formation of a hole pattern of 0.15 μm diameter.

Example 2.

The experimental procedure for the formation of a patterned resist layer was substantially the same as in Example 1 except that, in the formulation of the photoresist solution, the amount of the resin A1 was increased from 67 parts to 100 parts with omission of the resin A2.

The pattern resolution of the patterned resist layer thus obtained was so good that a hole pattern of 0.16 μm diameter could be obtained with good resolution. The focusing depth latitude was 0.90 μm for the formation of a hole pattern of 0.16 μm diameter.

Example 3.

The experimental procedure for the formation of a patterned resist layer was substantially the same as in Example 1 except that, in the formulation of the photoresist solution, diphenyliodonium trifluoromethanesulfonate was replaced with the same amount of diphenyliodonium nonafluorobutanesulfonate.

The pattern resolution of the patterned resist layer thus obtained was so good that a hole pattern of 0.16 μm diameter could be obtained with good resolution. The focusing depth latitude was 0.90 μm for the formation of a hole pattern of 0.16 μm diameter.

Comparative Example 1.

The experimental procedure for the formation of a patterned resist layer was substantially the same as in Example 1 except that, in the formulation of the photoresist solution, the resins A1 and A2 were replaced with 100 parts of a third copolymeric resin having a weight-average molecular weight of 8000 and consisting of 45% by moles of 1-ethylcyclohexyl methacrylate units and 55% by moles of 4-hydroxystyrene units.

The pattern resolution of the thus obtained patterned resist layer was clearly inferior as compared with the above described Examples, in which the lower limit of the resolved hole pattern diameter was 0.20 μm and the patterned resist layer had a downwardly narrowing cross sectional profile. The focusing depth latitude was 0.4 μm for the formation of a hole pattern of 0.20 μm diameter.

Comparative Example 2.

The experimental procedure for the formation of a patterned resist layer was substantially the same as in Example 1 except that, in the formulation of the photoresist solution, the resins A1 and A2 were replaced with a combination of 67 parts of a fourth copolymeric resin having a weight-average molecular weight of 10000 and consisting of 65% by moles of 4-hydroxystyrene units, 20% by moles of styrene units and 15% by moles of tert-butyl acrylate units and 33 parts of a fifth copolymeric resin having a weight-average molecular weight of 10000 and consisting of 75% by moles of 4-hydroxystyrene units, 20% by moles of styrene units and 5% by moles of tert-butyl acrylate units and further the fluorine-containing surface active agent was replaced with a fluorine- and silicon-containing surface active agent (Megafac R-08, a product by Dai-nippon Ink Chemical Co.) in an amount of 0.1% by weight based on the total amount of the solution.

Although the pattern resolution of the thus obtained patterned resist layer was not particularly inferior as compared with the above described Examples to give a well-resolved hole pattern of 0.15 μm diameter, the focusing depth latitude was 0.75 μm for the formation of a hole pattern of 0.15 μm diameter.

What is claimed is:

1. A positive-working chemical-amplification photoresist composition which comprises, as a uniform solution in an organic solvent:

(A) a resinous ingredient capable of being imparted with an increase in solubility in an aqueous alkaline solution by interacting with an acid and consisting essentially of (a) hydroxystyrene units or hydroxy-α-methylstyrene units, (b) styrene units and (c) 1-alkylcyclohexyl (meth)acrylate units represented by the general formula

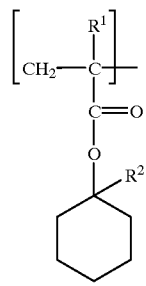

in which $R^1$ is a hydrogen atom or a methyl group and $R^2$ is an alkyl group having 1 to 5 carbon atoms, and wherein component (A) is a combination of a first copolymeric resin consisting essentially of the monomeric units (a), (b) and (c) in molar fractions of 50 to 70%, 10 to 30% and 10 to 20%, respectively, and a second copolymeric resin consisting essentially of the monomeric units (a), (b) and (c) in molar fractions of 50 to 70%, 20 to 40% and 2 to 10%, respectively, in a weight proportion in the range from 90:10 to 50:50;

(B) a radiation-sensitive acid-generating agent capable of releasing an acid by irradiation with actinic rays in an amount in the range from 1 to 10 parts by weight per 100 parts by weight of the component (A).

2. The positive-working chemical-amplification photoresist composition as claimed in claim 1 which further comprises: (C) an aliphatic tertiary amine compound in an amount in the range from 0.01 to 1.0 part by weight per 100 parts by weight of the component (A).

3. The positive-working chemical-amplification photoresist composition as claimed in claim 2 in which the component (C) is a trialkanolamine compound.

4. The positive-working chemical-amplification photoresist composition as claimed in claim 3 in which trialkanolamine compound is triethanolamine.

5. The positive-working chemical-amplification photoresist composition as claimed in claim 1 which further comprises: (D) a phosphorus-containing oxoacid compound in an amount in the range from 0.01 to 5.0 parts by weight per 100 parts by weight of the component (A).

6. The positive-working chemical-amplification photoresist composition as claimed in claim 5 in which the component (D) is a phenyl phosphonate.

7. The positive-working chemical-amplification photoresist composition as claimed in claim 1 in which the component (B) is an onium salt compound having a fluoroalkylsulfonate ion of 1 to 10 carbon atoms as the anion.

8. A positive-working chemical-amplification photoresist composition which comprises, as a uniform solution in an organic solvent:

(A) a resinous ingredient capable of being imparted with an increase in the solubility in an aqueous alkaline solution by interacting with an acid and consisting essentially of (a) hydroxystyrene units or hydroxy-α-methylstyrene units, (b) styrene units and (c) 1-alkylcyclohexyl (meth)acrylate units represented by the general formula

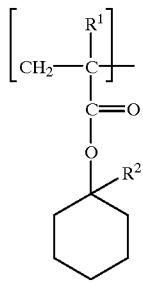

in which $R^1$ is a hydrogen atom or a methyl group and $R^2$ is an alkyl group having 2 to 4 carbon atoms, in molar fractions of 40 to 80%, 10 to 40% and 2 to 30%, respectively; and (B) a radiation-sensitive acid-generating agent capable of releasing an acid by irradiation with actinic rays in an amount in the range from 1 to 10 parts by weight per 100 parts by weight of the component (A).

9. The positive-working chemical-amplification photoresist composition as claimed in claim 8 which further comprises: (C) an aliphatic tertiary amine compound in an amount in the range from 0.01 to 1.0 part by weight per 100 parts by weight of the component (A).

10. The positive-working chemical-amplification photoresist composition as claimed in claim 9 in which the component (C) is a trialkanolamine compound.

11. The positive-working chemical-amplification photoresist composition as claimed in claim 10 in which trialkanolamine compound is triethanolamine.

12. The positive-working chemical-amplification photoresist composition as claimed in claim 8 which further comprises: (D) a phosphorus-containing oxoacid compound in an amount in the range from 0.01 to 5.0 parts by weight per 100 parts by weight of the component (A).

13. The positive-working chemical-amplification photoresist composition as claimed in claim 12 in which the component (D) is a phenyl phosphonate.

14. The positive-working chemical-amplification photoresist composition as claimed in claim 8 in which the component (B) is an onium salt compound having a fluoroalkylsulfonate ion of 1 to 10 carbon atoms as the anion.

* * * * *